(12) United States Patent
Kasai

(10) Patent No.: US 9,126,823 B2
(45) Date of Patent: Sep. 8, 2015

(54) MICROPHONE

(71) Applicant: OMRON Corporation, Kyoto-shi, Kyoto (JP)

(72) Inventor: Masaaki Kasai, Shiga (JP)

(73) Assignee: OMRON Corporation, Kyoto (JP)

( * ) Notice: Subject to any disclaimer, the term of this patent is extended or adjusted under 35 U.S.C. 154(b) by 0 days.

(21) Appl. No.: 14/224,238

(22) Filed: Mar. 25, 2014

(65) Prior Publication Data

US 2014/0306299 A1 Oct. 16, 2014

(30) Foreign Application Priority Data

Apr. 12, 2013 (JP) .................. 2013-083470

(51) Int. Cl.
*B81B 3/00* (2006.01)

(52) U.S. Cl.
CPC .................... *B81B 3/0027* (2013.01)

(58) Field of Classification Search
CPC .... B82B 7/0061; B81B 7/0061; B81B 7/008; B81B 3/0027
USPC ........................................ 257/419
See application file for complete search history.

(56) References Cited

U.S. PATENT DOCUMENTS

| 6,178,249 | B1 | 1/2001 | Hietanen et al. | |
| 7,763,972 | B2 | 7/2010 | Chien et al. | |
| 8,433,084 | B2 * | 4/2013 | Conti et al. | 381/174 |

* cited by examiner

*Primary Examiner* — William Coleman
(74) *Attorney, Agent, or Firm* — Osha Liang LLP

(57) ABSTRACT

A microphone has a base substrate comprising a main surface, an acoustic sensor mounted on the main surface, and a circuit element stacked on the acoustic sensor. A hollow space is formed between the acoustic sensor and the circuit element. The acoustic sensor has a sensor substrate having a first surface opposed to the base substrate, a second surface on a side opposite to the first surface, and a cavity formed while recessed with respect to the second surface, and a movable electrode that covers the cavity from the second surface side. A through-hole is formed in the base substrate while piercing the base substrate in a thickness direction. A communication hole is formed in the sensor substrate while piercing the sensor substrate from the first surface to the second surface. The communication hole causes the through-hole and the hollow space to communicate with each other.

15 Claims, 6 Drawing Sheets

MICROPHONE

BACKGROUND

1. Field

The present invention relates to a microphone, particularly to a microphone in which an acoustic sensor and a circuit element are stacked.

2. Related Art

A microphone is used in various devices such as a mobile phone and an digital voice recorder. For example, in the microphone disclosed in U.S. Pat. No. 6,178,249, an acoustic sensor and an application specific integrated circuit (ASIC) are connected to each other through a bump contact, a space between the acoustic sensor and the ASIC is used as a back chamber, and a volume of the back chamber is adjusted by changing the height of the bump contact. In the microphone disclosed in U.S. Pat. No. 7,763,972, an acoustic sensor and a circuit element are stacked, a cavity is formed in the circuit element at a position corresponding to a thin film, and the cavity is used as a back chamber.

Nowadays, there is a demand for further downsizing in the microphone, particularly there is a demand for a low profile in which a whole height of the microphone is reduced. On the other hand, there is also demand to enlarge the volume of the back chamber in order to improve a signal-to-noise ratio (SNR) and a frequency characteristic in a low frequency band.

The volume of the back chamber is defined by the height of the bump contact in a configuration disclosed in U.S. Pat. No. 6,178,249, and the volume of the back chamber is defined by the volume of the cavity formed in the circuit element in a configuration disclosed in U.S. Pat. No. 7,763,972. Therefore, in order to enlarge the volume of the back chamber, the height of the microphone needs to be increased, and thus it is difficult to simultaneously achieve the low profile of the microphone and the improvement of performance.

SUMMARY

One or more embodiments of the present invention achieves both the low profile of the microphone and the improvement of the acoustic characteristic.

In accordance with one or more embodiments of the present invention, a microphone includes: a base substrate including a main surface; an acoustic sensor mounted on the main surface; and a circuit element stacked on the acoustic sensor. In the microphone, a hollow space is formed between the acoustic sensor and the circuit element. The acoustic sensor includes a sensor substrate and a movable electrode. The sensor substrate includes a first surface opposed to the base substrate and a second surface on a side opposite to the first surface. A cavity is formed in the sensor substrate while recessed with respect to the second surface. The movable electrode is configured to cover the cavity from the second surface side. A through-hole is made in the base substrate while piercing the base substrate in a thickness direction. A communication hole is made in the sensor substrate while piercing the sensor substrate from the first surface to the second surface, and causes the through-hole and the hollow space to communicate with each other.

According to one or more embodiments of the present invention, a diameter of the through-hole made in the base substrate is formed larger than that of the communication hole made in the sensor substrate.

According to one or more embodiments of the present invention, the through-hole and the communication hole are made in plural.

According to one or more embodiments of the present invention, a recess in which at least one of the main surface and the first surface is recessed is formed, and an adhesive cured material in which a liquid adhesive is cured is accommodated in part of the recess.

According to one or more embodiments of the present invention, the base substrate includes a projection projected from the main surface, and the projection is projected from the main surface along a circumferential edge of the through-hole.

According to one or more embodiments of the present invention, the microphone further includes a sealing member. The sealing member seals the hollow space, and is disposed so as to surround the hollow space between the sensor substrate and the circuit element.

According to one or more embodiments of the present invention, both the low profile of the microphone and the improvement of the acoustic characteristic can be achieved.

DETAILED DESCRIPTION

Figure 1:
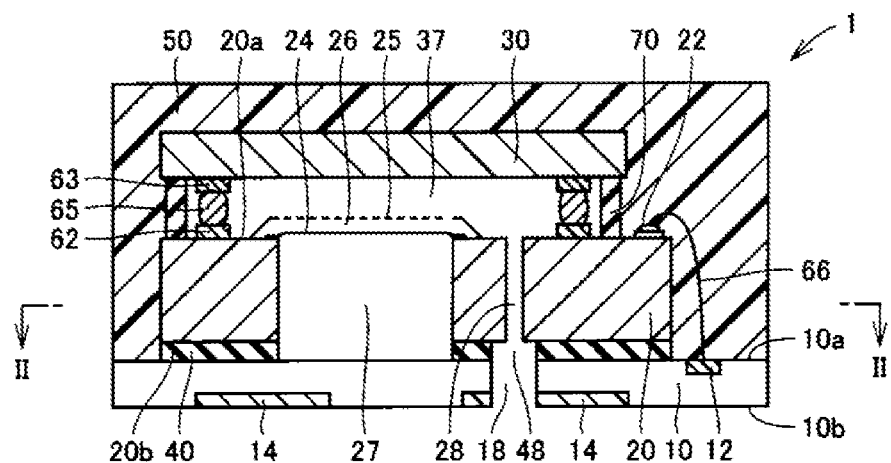
FIG. 1 is a sectional view illustrating a schematic configuration of a microphone according to a first embodiment.

Hereinafter, embodiments of the present invention will be described in detail with reference to the drawings. In the drawings, the identical or equivalent component is designated by the identical numeral, and the overlapping description is neglected. In embodiments of the invention, numerous specific details are set forth in order to provide a more thorough understanding of the invention. However, it will be apparent to one of ordinary skill in the art that the invention may be practiced without these specific details. In other instances, well-known features have not been described in detail to avoid obscuring the invention.

First Embodiment

FIG. 1 is a sectional view illustrating a schematic configuration of a microphone 1 according to a first embodiment.

Figure 2:
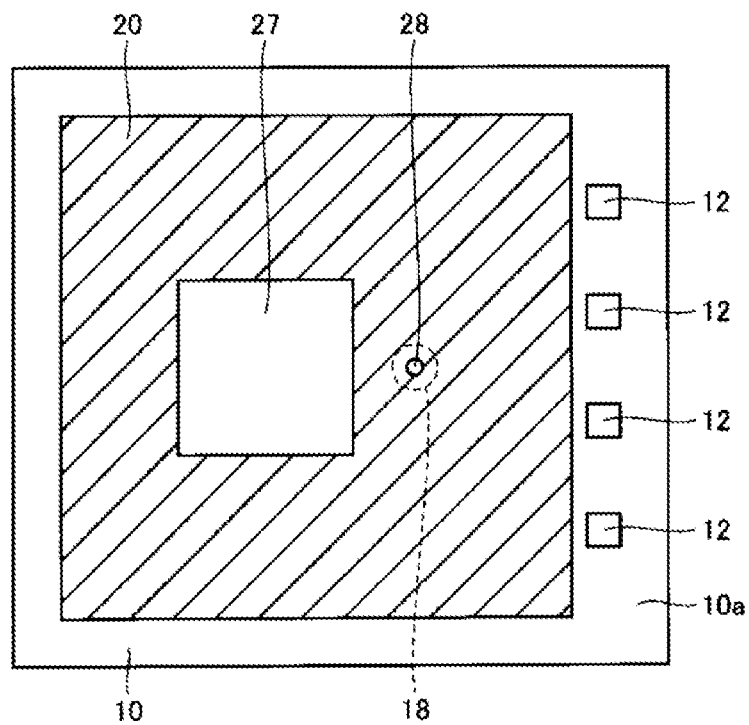
FIG. 2 is a sectional view taken along line II-II in FIG. 1 and illustrating the microphone of the first embodiment.

FIG. 2 is a sectional view taken along line II-II in FIG. 1 and illustrating the microphone 1 of the first embodiment. Referring to FIG. 1, the microphone 1 is an MEMS (Micro Electro Mechanical System) microphone that is produced using a MEMS technology, and the microphone 1 includes a plate substrate 10, an acoustic sensor (microphone chip) mounted on the plate substrate 10, and a circuit element 30.

The plate substrate 10 is a base substrate in the first embodiment, and is formed into a planar shape. The plate substrate 10 includes a main surface 10a and a connection surface 10b located on a side opposite to the main surface 10a. The acoustic sensor and the circuit element 30, which constitute the microphone 1, are disposed on the side of the main surface 10a of the plate substrate 10.

The plate substrate 10 includes a conductive layer 12 that is formed while exposed to the main surface 10a and an external connection terminal 14 that is formed in the connection surface 10b. The external connection terminal 14 is electrically connected to a connection terminal on a mother substrate side in mounting the microphone 1 on the mother substrate, thereby performing power supply and control signal transmission to the microphone 1.

The plate substrate 10 is formed by a planar multilayer wiring board. In the plate substrate 10, a conductive layer (not illustrated) that extends in a planar direction on a surface and in an inside of the plate substrate 10 and a via electrode (not illustrated) that extends in a thickness direction are formed in addition to the conductive layer 12 and external connection terminal 14 in FIG. 1. The conductive layer 12 is electrically connected to the external connection terminal 14 through the via electrode formed in the plate substrate 10. As used herein, the planar direction means a direction in which the main surface 10a and connection surface 10b of the planar plate substrate 10 extend, that is, a direction orthogonal to the thickness direction of the plate substrate 10. In FIG. 1, a vertical direction is the thickness direction of the plate substrate 10, and a horizontal direction is the planar direction.

In addition to the multilayer wiring board, the plate substrate 10 may be formed by a copper-clad laminate, a glass epoxy board, a ceramic board, a plastic board, a metallic board, a carbon nanotube board, or a composite board thereof.

The acoustic sensor is mounted on the main surface 10a of the plate substrate 10. The acoustic sensor includes a sensor substrate 20, a diaphragm 24, and a backplate 25.

The sensor substrate 20 is formed by a silicon substrate. The sensor substrate 20 is formed into a planar shape, and includes a first surface 20b and a second surface 20a. The first surface 20b and the second surface 20a constitute both main surfaces of the sensor substrate 20. The first surface 20b is one of the main surfaces of the sensor substrate 20, and is opposed to the main surface 10a of the plate substrate 10. The second surface 20a is the other main surface of the sensor substrate 20, and is located on the side opposite to the first surface 20b.

An adhesive layer 40 is disposed between the first surface 20b of the sensor substrate 20 and the main surface 10a of the plate substrate 10. The adhesive layer 40 is interposed between the main surface 10a and the first surface 20b. The first surface 20b of the sensor substrate 20 adheres to the main surface 10a of the plate substrate 10 using the adhesive layer 40. The sensor substrate 20 is fixed to the main surface 10a of the plate substrate 10 by the adhesive layer 40, whereby the acoustic sensor is mounted on the main surface 10a of the plate substrate 10.

The adhesive layer 40 may be formed by an adhesive tape, an adhesive film, a liquid adhesive, a conductive adhesive, or a combination thereof. In the case that the adhesive layer 40 is formed using the liquid adhesive such as epoxy resin and silicone resin, desirably a drop position and a drop amount are adjusted in consideration of spread of the liquid adhesive after application. Alternatively, metallic films may be formed on the main surface 10a of the plate substrate 10 and the first surface 20b of the sensor substrate 20 and bonded to each other, thereby forming the adhesive layer 40.

A cavity 27 is formed in the sensor substrate 20. The cavity 27 is formed into a shape recessed with respect to the second surface 20a of the sensor substrate 20. The cavity 27 is formed so as to reach the second surface 20a from the first surface 20b. The cavity 27 pierces the sensor substrate 20 in a thickness direction (vertical direction in FIG. 1) thereof. The cavity 27 has a hollow structure. An inner peripheral surface of the cavity 27 is formed as a perpendicular surface extending in the thickness direction of the sensor substrate 20. The inner peripheral surface of the cavity 27 may be formed as a tapered surface inclined with respect to the thickness direction of the sensor substrate 20, or formed by a combination of a plurality of tapered surfaces having different inclination angles with respect to the thickness direction of the sensor substrate 20.

The diaphragm 24 is formed into a thin-film shape, and has electric conductivity. Desirably the diaphragm 24 is formed by polysilicon/single crystal silicon thin film to which an impurity is added. The diaphragm 24 is attached to the second surface 20a of the sensor substrate 20 using an anchor (not illustrated). The diaphragm 24 is disposed so as to cover the cavity 27 from the side of the second surface 20a. The diaphragm 24 includes an edge portion supported by the second surface 20a of the sensor substrate 20 and a central portion covering the cavity 27. The central portion of the diaphragm 24 is disposed while floated slightly from the second surface 20a of the sensor substrate 20, and the central portion of the diaphragm 24 performs a membrane vibration in a manner responsive to an acoustic vibration. The diaphragm 24 acts as a movable electrode of the acoustic sensor.

The backplate 25 is disposed on the side of the second surface 20a of the sensor substrate 20 while opposed to the diaphragm 24, and the backplate 25 is directly fixed to the second surface 20a of the sensor substrate 20 or fixed to the second surface 20a with one of layers interposed therebetween. The backplate 25 includes a fixed film made of an insulating layer, desirably silicon nitride/silicon with no impurity, and a fixed electrode made of a conductive layer, desirably polysilicon/single crystal silicon thin film to which an impurity is added/a metallic film. The fixed electrode is provided on the surface of the fixed film on one of the side opposed to the diaphragm 24 and the side that is not opposed to the diaphragm 24. The backplate 25 has a cap shape covering the diaphragm 24.

An air gap 26 is formed between the backplate 25 and the diaphragm 24. The backplate 25 covers the cavity 27 at a position farther away from the sensor substrate 20 with respect to the diaphragm 24. Many acoustic holes are made in the backplate 25 in order to pass the acoustic vibration therethrough.

The fixed electrode of the backplate 25 and the diaphragm 24 that is of the movable electrode are in separate positions and constitute a capacitor while being opposed to each other. When an acoustic wave is incident to the acoustic sensor, the diaphragm 24 vibrates by acoustic pressure to change an electrostatic capacitance between the diaphragm 24 and the fixed electrode of the backplate 25. In the acoustic sensor of the first embodiment, the acoustic vibration (change in acoustic pressure) detected by the diaphragm 24 brings about a change in electrostatic capacitance between the diaphragm 24 and the fixed electrode, and is output as an electric signal. At least one pair of microphone terminals 22 is provided in the second surface 20a of the sensor substrate 20. The microphone terminals 22 output a detection signal according to the change in electrostatic capacitance between the diaphragm 24 and the fixed electrode.

The acoustic sensor is not limited to the above configuration, but the acoustic sensor may have another configuration as long as the diaphragm 24 that is of the movable electrode and the fixed electrode are disposed while opposed to each other. For example, the positions of the diaphragm 24 and backplate 25 may be replaced with each other in the thickness direction of the sensor substrate 20. The diaphragm 24 may be suspended from the backplate 25 and supported by the backplate 25. In a modification in which the fixed electrode is provided in the sensor substrate 20 or another substrate, the backplate 25 may be eliminated.

The circuit element 30 is disposed while the acoustic sensor is interposed between the circuit element 30 and the main surface 10a of the plate substrate 10. For example, the circuit element 30 may be an application specific integrated circuit (ASIC). The circuit element 30 has a planar shape. The circuit element 30 is disposed while separated from the second surface 20a of the sensor substrate 20, and a hollow space 37 is formed between the circuit element 30 and the second surface 20a of the sensor substrate 20. The diaphragm 24 and the backplate 25, which are provided in the second surface 20a of the sensor substrate 20, are accommodated in the space 37.

A conductive layer 62 is formed on the second surface 20a of the sensor substrate 20. A conductive layer 63 is formed on the main surface of the circuit element 30 on the side opposed to the sensor substrate 20. The conductive layer 62 formed on the second surface 20a of the sensor substrate 20 and the conductive layer 63 formed on the main surface of the circuit element 30 are electrically connected to each other with a conductive member 65 interposed therebetween. The conductive member 65 is formed by a metallic stacked film, a metallic bump, a conductive adhesive, solder, a conductive double-sided adhesive tape, a brazing material, or a combination thereof. The acoustic sensor and the planar circuit element 30 are electrically connected to each other by flip-chip bonding.

The conductive layer 12 formed in the plate substrate 10 and the microphone terminal 22 disposed on the second surface 20a of the sensor substrate 20 are connected to each other by a bonding wire 66. The detection signal of the acoustic sensor is input to the circuit element 30 through the conductive layer 62, the conductive member 65, and the conductive layer 63. After the circuit element 30 performs predetermined signal processing to the detection signal, the detection signal is output from the circuit element 30, and output to the external connection terminal 14 through the microphone terminal 22 provided in the sensor substrate 20 and the conductive layer 12.

A cyclic sealing member 70 is disposed between the sensor substrate 20 and the circuit element 30. The sealing member 70 is made of a non-conductive resin material such as an epoxy resin and a silicone resin. The sealing member 70 is provided along a peripheral edge portion of the circuit element 30, and disposed on outer peripheral sides of the conductive layer 62, the conductive member 65, and the conductive layer 63. The sealing member 70 has a height substantially identical to the total of height (a dimension in the thickness directions of the plate substrate 10 and the sensor substrate 20) of the conductive layer 62, the conductive member 65, and the conductive layer 63.

The sealing member 70 is in close contact with the sensor substrate 20 and the circuit element 30. The sealing member 70 is disposed while surrounding the space 37, and the sealing member 70 defines part of a boundary of the space 37. The sealing member 70 seals the space 37. The sealing member 70 acoustically seals the space 37. The sealing member 70 restrains a foreign matter from invading into the space 37. The sealing member 70 may be made of a conductive material. In this case, it is necessary that the sealing member 70 have a configuration in which electric interference with the space 37 can be restrained while different potential lines of the sensor substrate 20 and the circuit element 30 are not conducted to each other through the sealing member 70.

The circuit element 30 forms the space 37 together with the acoustic sensor, and is stacked on the acoustic sensor. The conductive layers 62 and 63 and the conductive member 65 are interposed between the circuit element 30 and the second surface 20a of the sensor substrate 20 constituting the acoustic sensor. The circuit element 30 is also stacked on the second surface 20a with the sealing member 70 interposed therebetween. The acoustic sensor and the circuit element 30 are sequentially stacked on the main surface 10a of the plate substrate 10.

The acoustic sensor and the circuit element 30 are physically protected by a protective layer 50 while wholly covered with the protective layer 50. The protective layer 50 is made of an insulating resin. The bonding wire 66 is disposed in the protective layer 50, and protected by the protective layer 50. The plate substrate 10 and the protective layer 50 constitute a housing of the microphone 1. The resin for forming the protective layer 50 is prevented from flowing into the space 37 by the disposition of the sealing member 70 between the space 37 and the protective layer 50.

Referring to FIGS. 1 and 2, a through-hole 18 is made in the plate substrate 10 while piercing the plate substrate 10 in the thickness direction. The through-hole 18 pierces the plate substrate 10 from the main surface 10a to the connection surface 10b. A hollow region 48 where the adhesive layer 40 is not provided is formed between the main surface 10a of the plate substrate 10 and the first surface 20b of the sensor substrate 20. The hollow region 48 pierces the adhesive layer 40. A communication hole 28 is made in the sensor substrate 20. The communication hole 28 pierces the sensor substrate 20 from the first surface 20b to the second surface 20a. The cavity 27 and the communication hole 28 are made in the sensor substrate 20 as the hole that has the shape piercing the sensor substrate 20 in the thickness direction. The communication hole 28 can be made at the same time as the cavity 27 is formed.

The through-hole 18, the hollow region 48, and the communication hole 28 overlap one another when the plate substrate 10 and the sensor substrate 20 are viewed in the thickness direction (that is, the vertical direction in FIG. 1 and the direction perpendicular to the paper plane in FIG. 2). The through-hole 18 and the hollow region 48 communicate with each other, the hollow region 48 and the communication hole 28 communicate with each other, and the communication hole 28 and the space 37 communicate with each other. The through-hole 18 communicates with the space 37 through the hollow region 48 and the communication hole 28. The communication hole 28 constitutes part of passage through which the through-hole 18 and the space 37 communicate with each other. The communication hole 28 acoustically connected to the through-hole 18 is made in the sensor substrate 20.

The through-hole 18, the hollow region 48, and the communication hole 28 constitute an acoustic port through which the acoustic vibration is introduced to the acoustic sensor. The acoustic port includes the through-hole 18 made in the plate substrate 10. The acoustic port also includes the hollow region 48 that is formed into the shape piercing the adhesive layer 40 while surrounded by the adhesive layer 40. The acoustic port also includes the communication hole 28 made in the sensor substrate 20. The sound is introduced to the microphone 1 through the acoustic port.

The microphone 1 includes a front chamber and a back chamber. The front chamber is a space located on the side closer to the acoustic port with respect to the diaphragm 24, and the back chamber is a hollow space located on the side farther away from the acoustic port with respect to the diaphragm 24. The front chamber and the back chamber are defined with the diaphragm 24 as the boundary. The space 37 surrounded by the sensor substrate 20, the circuit element 30, and the sealing member 70 acts as the front chamber of the microphone 1. The cavity 27 surrounded by the plate substrate 10 and the sensor substrate 20 acts as the back chamber of the microphone 1.

The microphone 1 has an acoustic structure in the order of the through-hole 18 made in the plate substrate 10, the communication hole 28 made in the acoustic sensor, the front chamber formed by the space 37, the diaphragm 24, and the back chamber formed by the cavity 27.

The through-hole 18 is a round hole in which a circular shape emerges in the section of the plate substrate 10 parallel to the main surface 10a. The communication hole 28 is a round hole in which a circular shape emerges in the section of the sensor substrate 20 parallel to the first surface 20b. When being viewed in the thickness directions of the plate substrate 10 and the sensor substrate 20, the through-hole 18 has an area larger than that of the communication hole 28. The through-hole 18 is made larger than the communication hole 28. When an opening of the communication hole 28 opened to the first surface 20b of the sensor substrate 20 is projected to the main surface 10a of the plate substrate 10, the projection image is wholly overlapped by an opening of the through-hole 18 opened to the main surface 10a, and is accommodated in the opening of the through-hole 18 opened to the main surface 10a.

According to the microphone 1 of the first embodiment, the acoustic sensor is mounted on the main surface 10a of the plate substrate 10, the through-hole 18 is made in the plate substrate 10 while piercing the plate substrate 10, and the communication hole 28 is made in the sensor substrate 20 of the acoustic sensor while piercing the sensor substrate 20. The external space of the microphone 1 on the side of the connection surface 10b of the plate substrate 10 and the space 37 formed between the sensor substrate 20 and the circuit element 30 communicate with each other through the through-hole 18 and the communication hole 28.

Therefore, the acoustic port through which the sound is introduced to the microphone 1 communicates with the space 37 to be able to introduce the acoustic vibration to the space 37, so that the space 37 can be used as the front chamber of the microphone 1. The cavity 27 formed in the sensor substrate 20 is used as the back chamber of the microphone 1 because the cavity 27 is separated from the front chamber by the diaphragm 24. It is not necessary to largely ensure the space 37 as the back chamber unlike in U.S. Pat. No. 7,763,972, because the cavity 27 recessed with respect to the second surface 20a of the sensor substrate 20 can be used as the back chamber. Accordingly, the low-profile microphone 1 can be constructed.

The communication hole 28 can be made at the same time as the cavity 27 is formed in the sensor substrate 20 or as the conductive layer 62 is formed on the sensor substrate 20. Because an additional process is not required to make the communication hole 28, an increase of production cost can be avoided, and the communication hole 28 can be made with good productivity.

The front chamber of the microphone 1 is formed by the space 37 between the sensor substrate 20 and the circuit element 30. The space 37 is sealed while surrounded by the sealing member 70. Because the circuit element 30 can be thinned without necessity to process the cavity in the circuit element 30 to form the front chamber, the low-profile circuit element 30 can be constructed, and therefore the low profile of the microphone 1 can be achieved.

The back chamber of the microphone 1 is formed by the cavity 27 formed in the sensor substrate 20. The sensor substrate 20 has the relatively large dimension in the thickness direction, so that a volume of the cavity 27 can be enlarged to increase a volume of the back chamber. As a result, air in the back chamber acts as an air spring to restrain disturbance to the vibration of the diaphragm 24, and the diaphragm 24 can vibrate freely in introducing the acoustic wave into the microphone 1. Accordingly, a signal-to-noise ratio (SNR) can be enhanced to improve sensitivity of the microphone 1. Additionally, a frequency characteristic of the microphone 1 can particularly be improved in a low frequency band by increasing the volume of the back chamber, and the performance of the microphone 1 can be improved.

The larger diameter of the acoustic port has an advantage in the characteristic of the microphone 1. The acoustic port of the first embodiment includes the through-hole 18, the hollow region 48, and the communication hole 28. One or more embodiments of the present invention achieves an acoustic performance equal to or greater than that of the conventional microphone by sufficiently increasing the diameters of the through-hole 18, the hollow region 48, and the communication hole 28.

The circuit element 30 is stacked on the acoustic sensor. The dimension in the height direction of the microphone 1 increases due to the stacked structure. Therefore, by using the acoustic port of the first embodiment, the effect to achieve the low profile of the microphone 1 can be significantly obtained. That is, the acoustic port of the first embodiment is particularly suitably applied to the microphone 1 in which the acoustic sensor and the circuit element are stacked on each other.

Using the adhesive layer 40, the acoustic sensor is fixed onto the main surface 10a of the plate substrate 10 by die bonding. The microphone terminal 22 and the conductive layer 12 are connected to each other by the wire bonding, which electrically connects the acoustic sensor and the plate substrate 10. Flip-chip mounting is not used in mounting the acoustic sensor on the plate substrate 10, and pressure is not applied to the acoustic sensor. During the mounting, the pressure is relaxed over the whole first surface 20b of the sensor substrate 20, so that the pressure is restrained from being locally applied to the acoustic sensor. Accordingly, a breakage of a pressure sensor can be reduced during the mounting.

Because the diameter of the through-hole 18 made in the plate substrate 10 is larger than that of the communication hole 28 made in the sensor substrate 20, misalignment can be permitted in mounting the acoustic sensor on the plate substrate 10, and the productivity can be improved. In the case that the liquid adhesive is used to cause the sensor substrate 20 to adhere to the plate substrate 10, possibly the liquid adhesive flows along the main surface 10a after the liquid adhesive is supplied onto the main surface 10a. Even if the liquid adhesive flows into the through-hole 18 to partially close the through-hole 18, the acoustic port is ensured by forming the through-hole 18 having the large diameter, and the sound can be transmitted to the acoustic sensor through the through-hole 18. Accordingly, the acoustic characteristic of the microphone 1 can surely be exerted.

Second Embodiment

Figure 3:
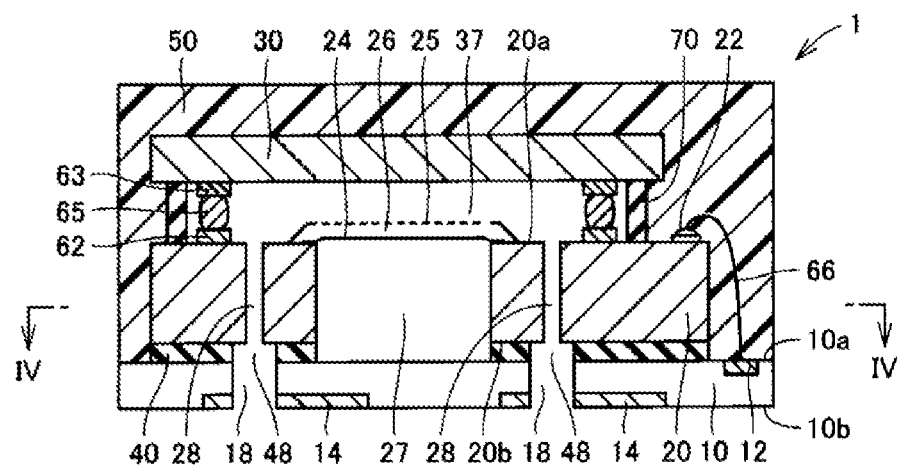
FIG. 3 is a sectional view illustrating a schematic configuration of a microphone according to a second embodiment.
Figure 4:
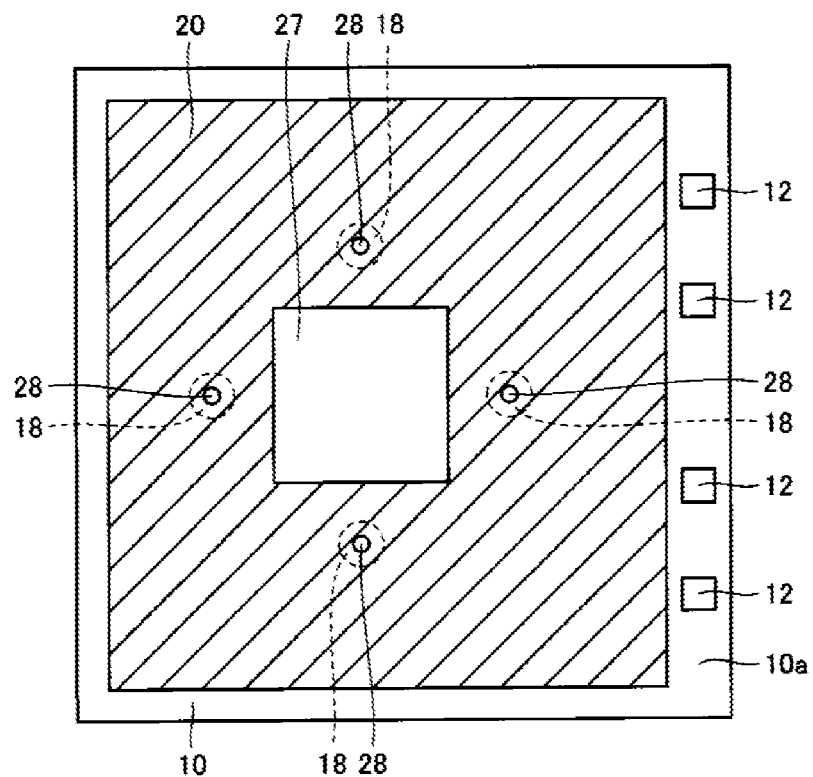
FIG. 4 is a sectional view taken along line IV-IV in FIG. 3 and illustrating the microphone of the second embodiment.

FIG. 3 is a sectional view illustrating a schematic configuration of a microphone 1 according to a second embodiment. FIG. 4 is a sectional view taken along line IV-IV in FIG. 3 and illustrating the microphone 1 of the second embodiment. The microphone 1 of the second embodiment differs from that of the first embodiment in the number of acoustic ports each of which is formed by the through-hole 18, the hollow region 48, and the communication hole 28.

The one acoustic port is formed in the first embodiment. On the other hand, in the second embodiment in FIG. 4, a plurality of through-holes 18 and a plurality of communication holes 28 are made, and one through-hole 18 overlaps one communication hole 28 in the thickness directions of the plate substrate 10 and the sensor substrate 20. The external space of the microphone 1 and the space 37 communicate with each other through the through-hole 18 and the communication hole 28, which are formed so as to overlap each other, thereby forming the plurality of acoustic ports. The diameter of each through-hole 18 is formed larger than that of the corresponding communication hole 28.

According to the microphone 1 of the second embodiment, a total of sectional areas of the acoustic ports increases because the four acoustic ports similar to the acoustic port of the first embodiment are formed. As a result, similarly to the case that the diameter of the acoustic port is increased, acoustic inertance can be reduced, and advantageously the frequency characteristic is improved. Therefore the microphone 1 having the better acoustic characteristic can be provided. The number of acoustic ports may be set as many as possible within a range where rigidity of the plate substrate 10 and the sensor substrate 20 can be ensured.

Third Embodiment

Figure 5:
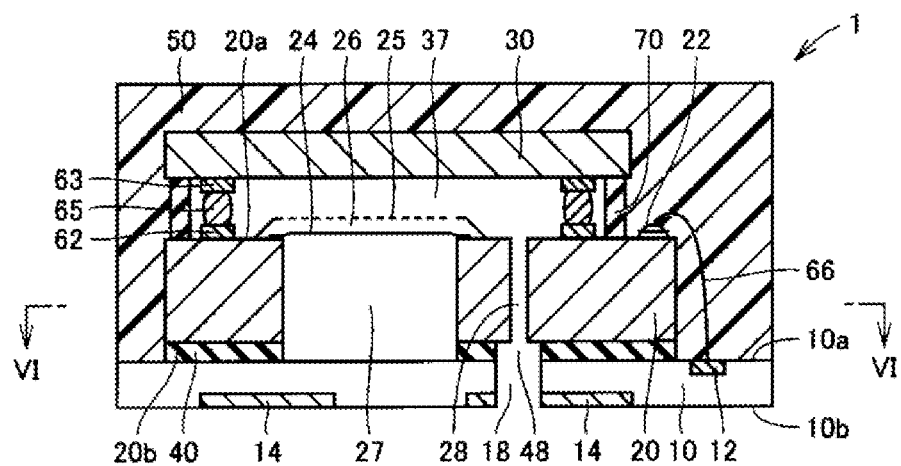
FIG. 5 is a sectional view illustrating a schematic configuration of a microphone according to a third embodiment.
Figure 6:
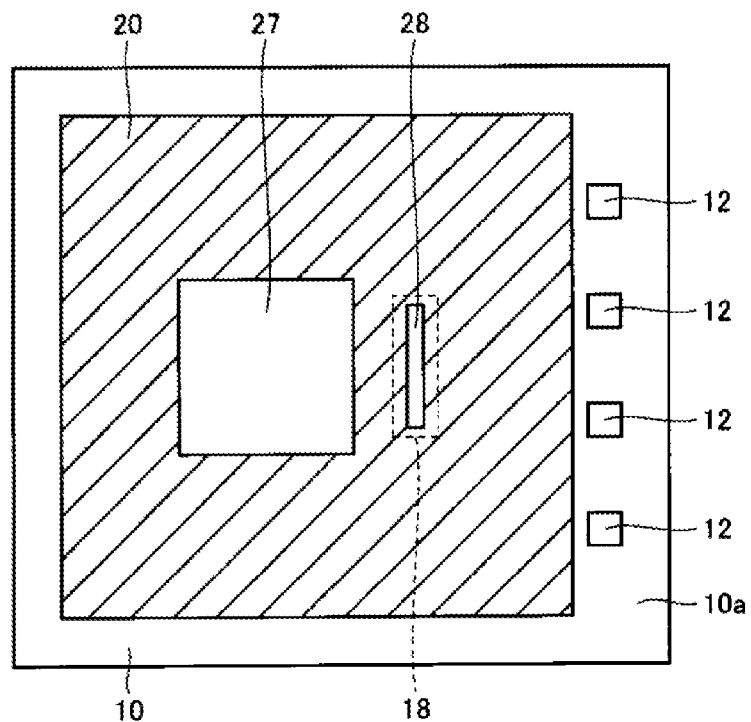
FIG. 6 is a sectional view taken along line VI-VI in FIG. 5 and illustrating the microphone of the third embodiment.

FIG. 5 is a sectional view illustrating a schematic configuration of a microphone 1 according to a third embodiment. FIG. 6 is a sectional view taken along line VI-VI in FIG. 5 and illustrating the microphone 1 of the third embodiment. The microphone 1 of the third embodiment differs from that of the first embodiment in the shape of the acoustic port that is formed by the through-hole 18, the hollow region 48, and the communication hole 28.

More specifically, the through-hole 18 and the communication hole 28 viewed from above are illustrated in the sectional view of FIG. 6. The through-hole 18 of the first embodiment in FIG. 2 has the round shape, while the through-hole 18 of the third embodiment has a slit shape. The through-hole 18 has the shape extending along the outer periphery of the cavity 27. The through-hole 18 is made along the peripheral edge of the cavity 27 in the first surface 20b of the sensor substrate 20.

The hollow region 48 is formed according to the slit-like through-hole 18 while the adhesive layer 40 is not provided in a region along the peripheral edge of the cavity 27 between the main surface 10a and the first surface 20b. The communication hole 28 also has the slit shape according to the slit-like through-hole 18. The communication hole 28 has the shape extending along the outer periphery of the cavity 27, and is formed along the peripheral edge of the cavity 27 in the first surface 20b of the sensor substrate 20. When viewed from above, the cavity 27 has the rectangular shape, and the through-hole 18 and the communication hole 28 are made along one of sides of the rectangle.

According to the microphone 1 of the third embodiment, because the through-hole 18 is made along the peripheral edge of the cavity 27 in the first surface 20b as illustrated in FIG. 6, a sectional area of the through-hole 18 emerging on the section of the plate substrate 10 parallel to the main surface 10a is enlarged compared with the first embodiment. The through-hole 18 is made with the large opening area, and the hollow region 48 and the communication hole 28 are also made with the large opening area according to the through-hole 18, whereby the opening area of the acoustic port can be increased. Therefore, the acoustic inertance can be reduced, and the microphone 1 having the better acoustic characteristic can be provided. The shapes and the dimensions of the through-hole 18 and the communication hole 28 may be defined such that the opening areas of the through-hole 18 and the communication hole 28 are increased as much as possible within the range where the rigidity of the plate substrate 10 and the sensor substrate 20 can be ensured.

Fourth Embodiment

Figure 7:
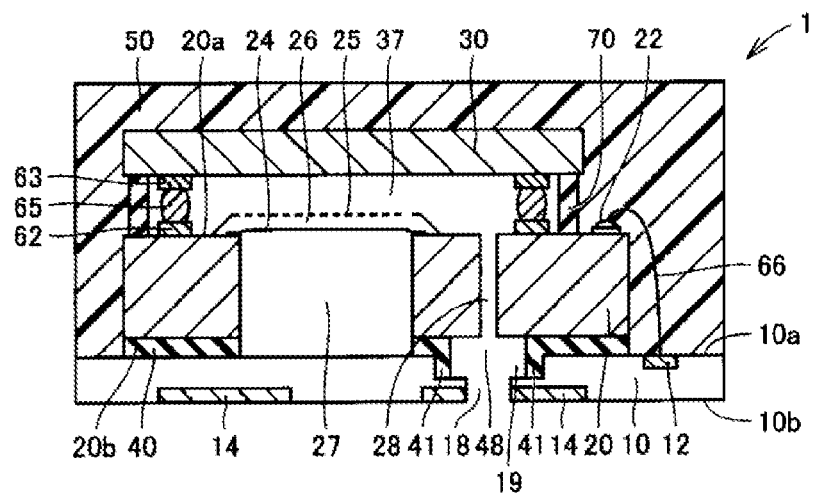
FIG. 7 is a sectional view illustrating a schematic configuration of a microphone according to a fourth embodiment.

FIG. 7 is a sectional view illustrating a schematic configuration of a microphone 1 according to a fourth embodiment. The microphone 1 of the fourth embodiment differs from the microphone 1 of the first embodiment in that a recess 19 in which the main surface 10a of the plate substrate 10 is recessed is formed in the plate substrate 10.

The recess 19 is formed while the main surface 10a adjacent to the through-hole 18 is recessed onto the side of the connection surface 10b. The main surface 10a is recessed on the side of the cavity 27 with respect to the through-hole 18 while recessed on the side farther away from the cavity 27 with respect to the through-hole 18, and the recess 19 is formed so as to surround the through-hole 18. The recess 19 and the hollow region 48 communicate with each other. The recess 19, the through-hole 18, and the hollow region 48 constitute the acoustic port through which the acoustic vibration is introduced to the acoustic sensor. The through-hole 18 may have the round shape like in the first embodiment, or have the slit shape like in the second embodiment.

An adhesive cured material 41 is accommodated in part of the recess 19. The adhesive cured material 41 is formed such that part of the liquid adhesive, which is applied to the main surface 10a in order to cause the acoustic sensor to adhere to the plate substrate 10, flows in the recess 19 and is cured in the recess 19.

In the microphone 1 of the fourth embodiment, the liquid adhesive such as an epoxy resin and a silicone resin is used to mount the acoustic sensor on the main surface 10a of the plate substrate 10. The sensor substrate 20 is caused to adhere to the plate substrate 10 using the liquid adhesive. In this case, the recess 19 is used as a reservoir (liquid accumulating portion) for the liquid adhesive. When the main surface 10a is recessed so as to surround the periphery of the through-hole 18, the liquid adhesive having fluidity is cured without reaching the through-hole 18 even if the liquid adhesive flows in the recess 19. As a result, the microphone 1 includes the adhesive cured material 41 accommodated in the recess 19. Therefore, the liquid adhesive is prevented from closing the acoustic port, so that the predetermined acoustic characteristic of the microphone 1 can be ensured.

The recess in which the first surface 20b of the sensor substrate 20 is recessed onto the side of the second surface 20a may be formed instead of or in addition to the recess 19 in FIG. 7 in which the main surface 10a of the plate substrate 10 is recessed. That is, the recess may be formed while at least one of the main surface 10a and the first surface 20b, which are opposed to each other, is recessed. Therefore, as described above, the liquid adhesive is prevented from closing the acoustic port, so that the predetermined acoustic characteristic of the microphone 1 can advantageously be obtained.

Fifth Embodiment

Figure 8:
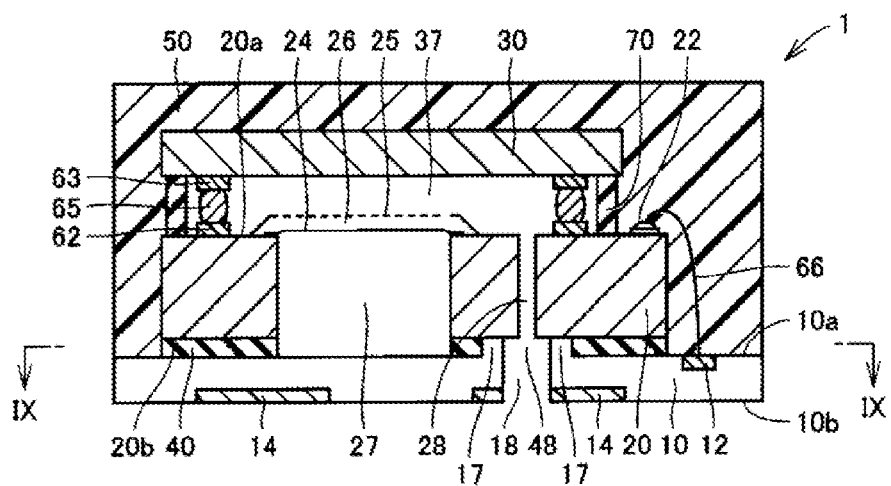
FIG. 8 is a sectional view illustrating a schematic configuration of a microphone according to a fifth embodiment.
Figure 9:
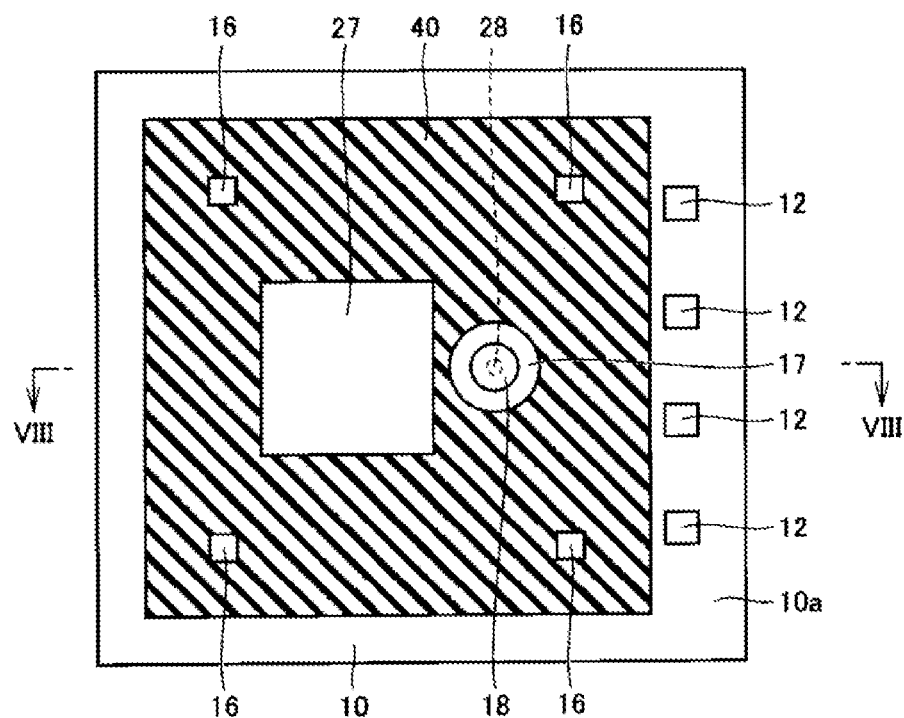
FIG. 9 is a sectional view taken along line IX-IX in FIG. 8 and illustrating the microphone of the fifth embodiment.

FIG. 8 is a sectional view illustrating a schematic configuration of a microphone 1 according to a fifth embodiment. FIG. 9 is a sectional view taken along line IX-IX in FIG. 8 and illustrating the microphone 1 of the fifth embodiment. FIG. 8 illustrates the section of the microphone 1 taken along line XIII-XIII in FIG. 9. The microphone 1 of the fifth embodiment differs from that of the first embodiment in the shape on the side of the main surface 10a of the plate substrate 10.

More specifically, the plate substrate 10 includes projections 16 and 17 projected from the main surface 10a. The plurality of projections 16 are formed so as to surround the cavity 27 of the sensor substrate 20. The four projections 16 are formed in the fifth embodiment in FIG. 9. In the projections 16 and 17, leading end portions farthest away from the main surface 10a are formed into a flat shape. The leading end portions of the projections 16 and 17 are disposed on the identical plane parallel to the main surface 10a of the plate substrate 10. The sensor substrate 20 of the acoustic sensor is mounted on the projections 16 and 17. The first surface 20b of the sensor substrate 20 is in surface contact with the leading end surfaces of the projections 16 and 17, and is supported by the projections 16 and 17.

The through-hole 18 is formed while piercing the plate substrate 10 in the thickness direction, and the through-hole 18 is opened to the main surface 10a. As illustrated in FIG. 9, the projection 17 is provided so as to be projected from the main surface 10a along the circumferential edge of the through-hole 18 in the main surface 10a. The through-hole 18 in FIG. 9 has the round shape, and the projection 17 is circularly formed along the outer circumference of the round hole. The projection 17 exists so as to surround the through-hole 18, whereby the adhesive layer 40 is separated from the through-hole 18 by the projection 17.

In the microphone 1 of the fifth embodiment, the liquid adhesive such as the epoxy resin and the silicone resin is used to mount the acoustic sensor on the main surface 10a of the plate substrate 10. The sensor substrate 20 is caused to adhere to the plate substrate 10 using the liquid adhesive. When the liquid adhesive is supplied to the main surface 10a, the projection 17 dams the flow of the liquid adhesive having the fluidity even if the liquid adhesive moves in the planar direction along the main surface 10a. The projection 17 acts as a barrier against the flow of the liquid adhesive. Accordingly, the liquid adhesive is prevented from reaching the through-hole 18 and flowing into the through-hole 18, and the liquid adhesive is prevented from closing the acoustic port, so that the predetermined acoustic characteristic of the microphone 1 can be ensured.

Sixth Embodiment

Figure 10:
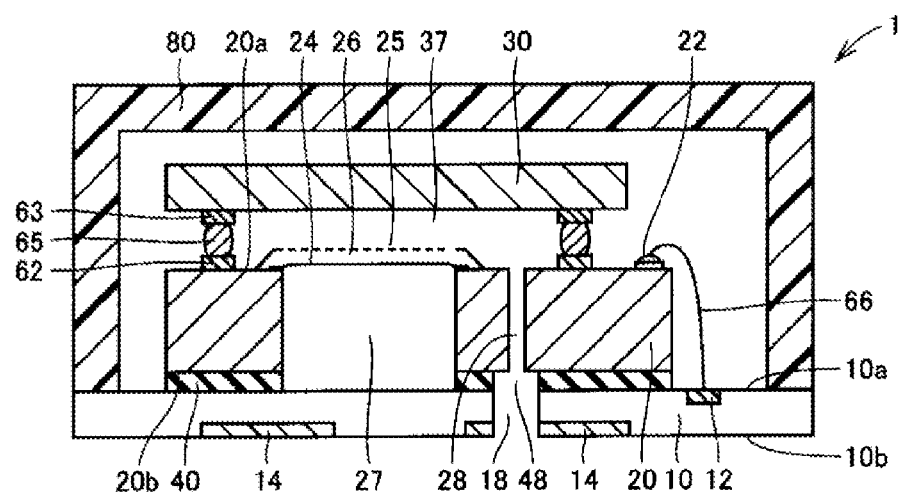
FIG. 10 is a sectional view illustrating a schematic configuration of a microphone according to a sixth embodiment.

FIG. 10 is a sectional view illustrating a schematic configuration of a microphone 1 according to a sixth embodiment. The microphone 1 of the sixth embodiment includes a cover member 80 having a downward angular C-shape. The cover member 80 is made of an insulating material typified by a resin material. The plate substrate 10 and the cover member 80 are assembled into the hollow box shape, and the hollow space is formed in the box shape. The acoustic sensor and the circuit element 30 are accommodated in an internal space of a package that is formed by the plate substrate 10 and the cover member 80. The plate substrate 10 and the cover member 80 constitute the housing of the microphone 1 of theسادس embodiment.

The cover member 80 covers the acoustic sensor and the circuit element 30, and protects the acoustic sensor and the circuit element 30 from the outside. The resin protective layer of the first embodiment is not provided in the microphone 1 of the sixth embodiment. Because the resin for forming the protective layer does not invade into the space 37, the sealing member is not provided between the sensor substrate 20 and the circuit element 30 in the microphone 1 of FIG. 10.

In the microphone 1 of the sixth embodiment having the above configuration, similarly to the first embodiment, the acoustic port through which the acoustic vibration is introduced to the space 37 is formed by the through-hole 18, the hollow region 48, and the communication hole 28. Therefore, the space 37 can be used as the front chamber, and the cavity 27 can be used as the back chamber, so that the low profile and the improvement of the performance can be implemented in the microphone 1.

Seventh Embodiment

Figure 11:
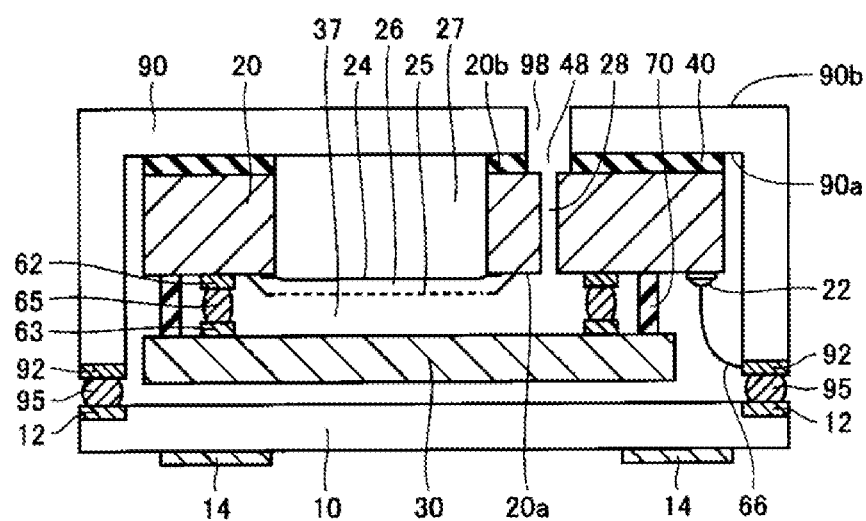
FIG. 11 is a sectional view illustrating a schematic configuration of a microphone according to a seventh embodiment.

FIG. 11 is a sectional view illustrating a schematic configuration of a microphone 1 according to a seventh embodiment. The microphone 1 of the seventh embodiment includes a cover member 90 having the downward angular C-shape. The cover member 90 is made of the insulating material typified by the resin material. The cover member 90 having the downward C-shape may be formed by cutting, or formed by attaching frames on peripheral edge portions of the planar substrate.

The plate substrate 10 and the cover member 90 are assemble into the hollow box shape, and the hollow space is formed in the box shape. The acoustic sensor and the circuit element 30 are accommodated in the internal space of the package that is formed by the plate substrate 10 and the cover member 90. The plate substrate 10 and the cover member 90 constitute the housing of the microphone 1 of the seventh embodiment.

The cover member 90 includes a main surface 90a on the side opposed to the plate substrate 10 and an outer surface 90b on the side opposite to the main surface 90a. The acoustic sensor is mounted on the main surface 90a of the cover member 90. The cover member 90 acts as the base member of the seventh embodiment. The circuit element 30 is disposed away from the second surface 20a of the sensor substrate 20, and the hollow space 37 is formed between the circuit element 30 and the second surface 20a of the sensor substrate 20.

The sensor substrate 20 of the acoustic sensor and the circuit element 30 are electrically connected to each other through the conductive layers 62 and 63 and the conductive member 65. The cyclic sealing member 70 is disposed between the sensor substrate 20 and the circuit element 30. The sealing member 70 is in close contact with the sensor substrate 20 and the circuit element 30 to acoustically seal the space 37. The sealing member 70 may be disposed between the leading end portion of the C-shape of the cover member 90 and the plate substrate 10, and desirably the sealing member 70 is disposed between the sensor substrate 20 and the circuit element 30 as illustrated in FIG. 8 because the volume of the front chamber can be reduced.

A conductive layer 92 is exposed to the leading end portion of the C-shape of the cover member 90. The conductive layer 92 and the conductive layer 12 formed in the plate substrate 10 are disposed while opposed to each other. The conductive layer 12 and the conductive layer 92 are electrically connected to each other through the conductive member 95. The conductive member 95 is formed by a metallic stacked film, a metallic bump, a conductive adhesive, solder, a conductive double-sided adhesive tape, a brazing material, or a combination thereof. The microphone terminal 22 provided on the sensor substrate 20 and the conductive layer 92 formed on the cover member 90 are connected to each other by the bonding wire 66. A through-hole 98 is made in the cover member 90 while piercing the cover member 90 in the thickness direction. The through-hole 98 constitutes part of the acoustic port.

A top-port type microphone 1 is constructed by the above configuration. In the top-port type microphone 1, the acoustic port is provided at the position distant from the plate substrate 10 that is mounted on the mother substrate while including the external connection terminal 14. Interference of the acoustic port and the external connection terminal 14 can securely be avoided by providing the top-port type microphone 1, and generation of a drawback can securely be restrained in mounting the microphone 1 on the mother substrate.

In the microphone 1 of the seventh embodiment, similarly to the first embodiment, the acoustic port through which the acoustic vibration is introduced to the space 37 is formed by the through-hole 98, the hollow region 48, and the communication hole 28. Therefore, the space 37 is used as the front chamber, and the cavity 27 is used as the back chamber, so that the low profile and the improvement of the performance can be implemented in the microphone 1.

In one or more of the above embodiments, by way of example, the acoustic sensor and the planar circuit element 30 are electrically connected to each other by the flip-chip bonding or the wire bonding. Alternatively, the circuit element 30 and the acoustic sensor may electrically be connected to each other using a through silicon via (TSV) piercing the circuit element 30.

In one or more of the above embodiments, the circuit element 30 has the planar shape by way of example. Alternatively, the circuit element 30 having the downward angular C-shape may be mounted on the second surface 20a of the sensor substrate 20. The hollow space is formed between the C-shape circuit element 30 and the second surface 20a of the sensor substrate 20 to act as the front chamber of the microphone 1. In this case, the sealing member 70 sealing the front chamber can be replaced with the adhesive between the sensor substrate 20 and the circuit element 30.

The microphone 1 may further include a conductive electromagnetic shield in order to reduce an electromagnetic noise. The electromagnetic shield may be disposed on the surface on the side opposite to the surface opposed to the acoustic sensor in the surfaces of the circuit element 30. Alternatively, the electromagnetic shield may be disposed on the outer surface of the housing of the microphone 1, and the electromagnetic shield may be disposed on the inner surface of a cover member when the cover member is provided.

Although embodiments of the present invention are described above, the embodiments may modified or combined within a scope of the present invention. The disclosed embodiments of the present invention are not restrictive, but illustrative in all respects. The scope of the present invention is indicated by not the above description but claims, and the meaning equivalent to the claims and all the changes within the claims are included in the present invention.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. A microphone comprising:
   a base substrate comprising a main surface;
   an acoustic sensor mounted on the main surface; and
   a circuit element stacked on the acoustic sensor,
   wherein a hollow space is formed between the acoustic sensor and the circuit element,
   wherein the acoustic sensor comprises:
      a sensor substrate comprising:
         a first surface opposed to the base substrate,
         a second surface on a side opposite to the first surface, and
         a cavity formed while recessed with respect to the second surface, and
      a movable electrode that covers the cavity from the second surface side,
   wherein a through-hole is formed in the base substrate while piercing the base substrate in a thickness direction,
   wherein a communication hole is formed in the sensor substrate while piercing the sensor substrate from the first surface to the second surface,
   wherein the communication hole causes the through-hole and the hollow space to communicate with each other,
   wherein the microphone further comprises a sealing member that seals the hollow space, and
   wherein the sealing member is disposed so as to surround the hollow space between the sensor substrate and the circuit element.

2. The microphone according to claim 1, wherein a diameter of the through-hole is formed larger than that of the communication hole.

3. The microphone according to claim 1, wherein the through-hole and the communication hole are made in plural.

4. The microphone according to claim 1,
   wherein a recess formed in at least one of the main surface and the first surface, and
   wherein an adhesive cured material in which a liquid adhesive is cured is accommodated in part of the recess.

5. The microphone according to claim 1,
   wherein the base substrate comprises a projection projected from the main surface, and
   wherein the projection is projected from the main surface along a circumferential edge of the through-hole.

6. The microphone according to claim 2, wherein the through-hole and the communication hole are made in plural.

7. The microphone according to claim 2,
   wherein a recess formed in at least one of the main surface and the first surface, and
   wherein an adhesive cured material in which a liquid adhesive is cured is accommodated in part of the recess.

8. The microphone according to claim 2,
   wherein the base substrate comprises a projection projected from the main surface, and
   wherein the projection is projected from the main surface along a circumferential edge of the through-hole.

9. The microphone according to claim 2, further comprising:
   a sealing member that seals the hollow space,
   wherein the sealing member is disposed so as to surround the hollow space between the sensor substrate and the circuit element.

10. The microphone according to claim 3,
wherein a recess formed in at least one of the main surface and the first surface, and
wherein an adhesive cured material in which a liquid adhesive is cured is accommodated in part of the recess.

11. The microphone according to claim 3,
wherein the base substrate comprises a projection projected from the main surface, and
wherein the projection is projected from the main surface along a circumferential edge of the through-hole.

12. The microphone according to claim 3, further comprising:
a sealing member that seals the hollow space,
wherein the sealing member is disposed so as to surround the hollow space between the sensor substrate and the circuit element.

13. The microphone according to claim 4,
wherein the base substrate comprises a projection projected from the main surface, and
wherein the projection is projected from the main surface along a circumferential edge of the through-hole.

14. The microphone according to claim 4, further comprising:
a sealing member that seals the hollow space,
wherein the sealing member is disposed so as to surround the hollow space between the sensor substrate and the circuit element.

15. The microphone according to claim 5, further comprising:
a sealing member that seals the hollow space,
wherein the sealing member is disposed so as to surround the hollow space between the sensor substrate and the circuit element.

* * * * *